United States Patent
Ishino et al.

(10) Patent No.: US 11,279,005 B2
(45) Date of Patent: Mar. 22, 2022

(54) VACUUM SUCTION MEMBER AND VACUUM SUCTION METHOD

(71) Applicant: NGK SPARK PLUG CO., LTD., Aichi (JP)

(72) Inventors: Tomohiro Ishino, Tomiya (JP); Shinya Kikuchi, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 186 days.

(21) Appl. No.: 15/740,947

(22) PCT Filed: Feb. 6, 2017

(86) PCT No.: PCT/JP2017/004140
§ 371 (c)(1),
(2) Date: Dec. 29, 2017

(87) PCT Pub. No.: WO2017/154436
PCT Pub. Date: Sep. 14, 2017

(65) Prior Publication Data
US 2018/0193983 A1 Jul. 12, 2018

(30) Foreign Application Priority Data
Mar. 9, 2016 (JP) .............................. JP2016-046047

(51) Int. Cl.
*B25B 11/00* (2006.01)
*H01L 21/683* (2006.01)

(52) U.S. Cl.
CPC ........ *B25B 11/005* (2013.01); *H01L 21/6838* (2013.01)

(58) Field of Classification Search
CPC .............. B25B 11/00; B25B 11/005
(Continued)

(56) References Cited

U.S. PATENT DOCUMENTS

| | | | | |
|---|---|---|---|---|
| 5,634,749 A | * | 6/1997 | Edis | ...................... B25B 11/005 269/21 |
| 2002/0127956 A1 | | 9/2002 | Ashjaee et al. | |
| 2017/0053822 A1 | * | 2/2017 | Ben Natan | .......... H01L 21/6838 |

FOREIGN PATENT DOCUMENTS

| | | |
|---|---|---|
| JP | H03-289154 A | 12/1991 |
| JP | H07-308856 A | 11/1995 |

(Continued)

OTHER PUBLICATIONS

Japan Patent Office, International Search Report in International Stage of the instant application, dated Apr. 12, 2017.

*Primary Examiner* — Lee D Wilson
*Assistant Examiner* — Thomas Raymond Rodgers
(74) *Attorney, Agent, or Firm* — Stites & Harbison, PLLC; Jeffrey A. Haeberlin; James R. Hayne

(57) ABSTRACT

Provided are a vacuum chuck member and a vacuum chuck method that are capable of suppressing misalignment of a substrate when a wafer having a significant deflection or warpage is chucked and held.

In a state in which a wafer W is placed on the upper surface side of a base 1, the pressure in an inner space S1 surrounded by the upper surface of the base 1, the lower surface of the wafer W, and the inner side surface of an inner annular rib 21 is reduced through a first air passage 101. Subsequently, the pressure in an outer space S2 surrounded by the upper surface of the base 1, the lower surface of the wafer W, the outer side surface of the inner annular rib 21, and the inner side surface of an outer annular rib 22 is reduced through a second air passage 102.

6 Claims, 5 Drawing Sheets

(58) Field of Classification Search
USPC .......................................... 269/21, 900, 903
See application file for complete search history.

(56) References Cited

FOREIGN PATENT DOCUMENTS

| | | |
|---|---|---|
| JP | 2004-228453 A | 8/2004 |
| JP | 2005-528794 A | 9/2005 |
| JP | 2007-273693 A | 10/2007 |
| JP | 2015-038982 A | 2/2015 |

* cited by examiner

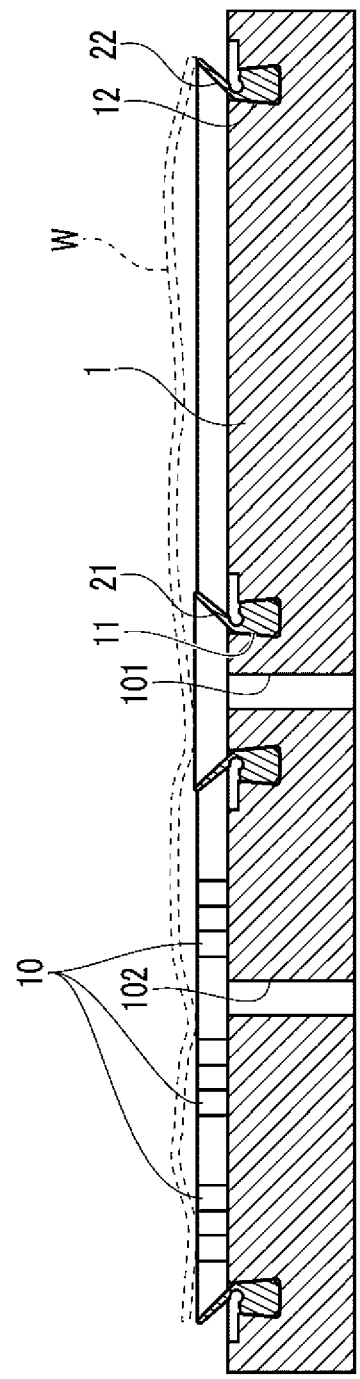

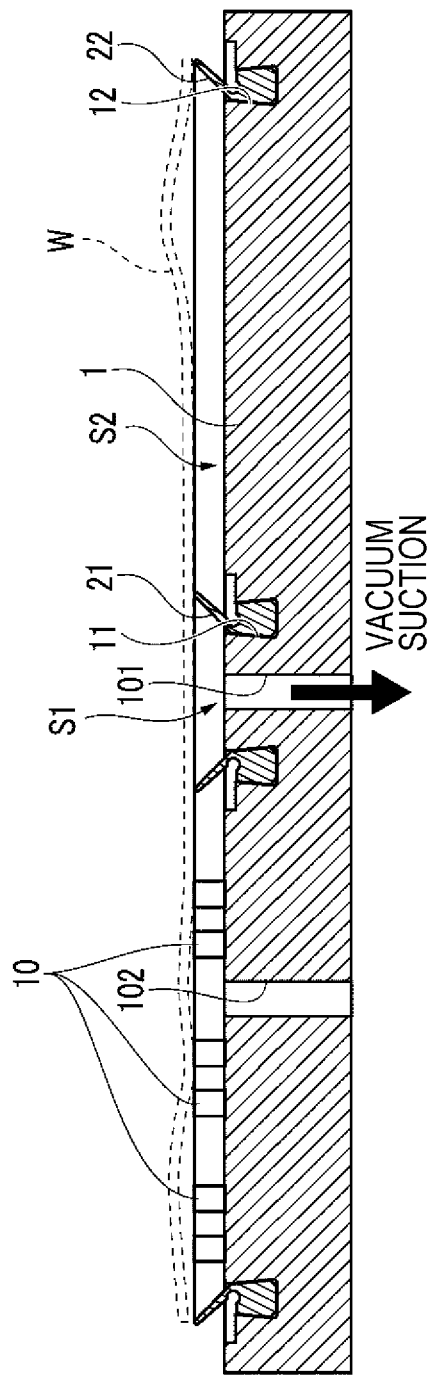

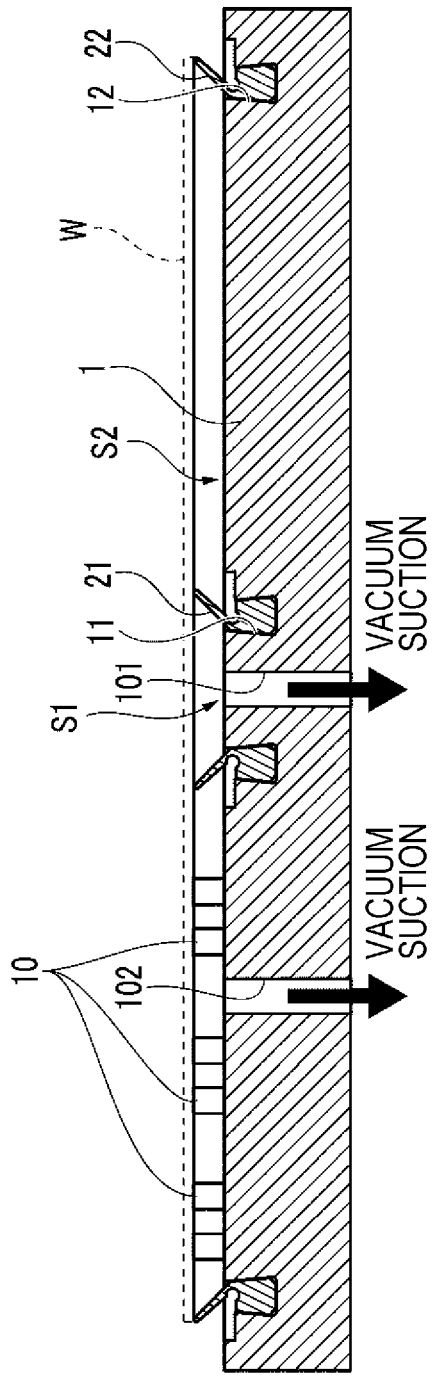

VACUUM SUCTION MEMBER AND VACUUM SUCTION METHOD

TECHNICAL FIELD

The present invention relates to a technique for chucking and holding a substrate such as a wafer under vacuum.

BACKGROUND ART

A chuck holder structure for a wafer processing machine is proposed. The chuck holder structure includes a skirt-like seal member formed of an elastic material (for example, rubber) so as to expand gradually outward from bottom to top on the outer edge of a base (see, for example, PTL 1).

According to the chuck holder structure described above, even if a wafer has a warpage, undulations, or steps, the upper end portion of the seal member is brought into contact with the wafer over the entire periphery thereof and a sealed area is formed in a space between the wafer and a chuck surface. Therefore, the wafer can be chucked and held with the sealed area being kept at a negative pressure by eliminating influence of the space that is originally formed between the wafer and the base due to the warpage of the wafer or other factors.

CITATION LIST

Patent Literature

PTL 1: Japanese Unexamined Patent Application Publication No. 7-308856

SUMMARY OF INVENTION

Technical Problem

If a wafer has a significant deflection or warpage, however, when the substrate is transported to a vacuum chuck member, the substrate is in point contact or surface contact with the vacuum chuck member due to the warpage or deformation of the substrate. When suction starts in this state with a vacuum pump or the like, misalignment occurs in many cases at a stage at which the substrate is chucked and held by reducing the pressure in the space.

In view of the above, the present invention has an object to provide a vacuum suction member (hereinafter called "a vacuum chuck member") and a vacuum suction method (hereinafter called "a vacuum chuck method") that are capable of suppressing misalignment when a wafer having a significant deflection or warpage is chucked and held.

Solution to Problem

The present invention relates to a vacuum chuck member including a base in which an annular groove portion is formed to be recessed in an annular shape from an upper surface of the base and in which an air passage that communicates with a space above the upper surface is formed on an inner side of the annular groove portion, and an annular rib which is formed of an elastic material and a lower portion of which is accommodated in the annular groove portion in a state in which an upper portion of the annular rib projects in an annular shape from the upper surface of the base. The vacuum chuck member is configured to chuck and hold a substrate by reducing a pressure in a space, which is defined by the base, the annular rib, and the substrate, through the air passage in a state in which the substrate is placed on an upper surface side of the vacuum chuck member. The present invention further relates to a method for chucking and holding a substrate by using the vacuum chuck member.

In the vacuum chuck member of the present invention, an auxiliary annular groove portion is formed to be recessed in an annular shape from the upper surface of the base on an inner side of the annular groove portion and to correspond to a central portion of the substrate. A part of the air passage is formed inside the base so as to communicate with a space above the upper surface of the base on an inner side of the auxiliary annular groove portion. The vacuum chuck member further includes an auxiliary annular rib which is formed of an elastic material and a lower portion of which is accommodated in the auxiliary annular groove portion in a state in which an upper portion of the auxiliary annular rib projects in an annular shape from the upper surface of the base.

A vacuum chuck method of the present invention includes a step of placing the substrate on the vacuum chuck member so that a lower surface of the substrate is brought into contact with an annular upper end of the annular rib at least partially along a circumferential direction, a step of applying a downward external force to a central portion of the substrate, and a step of reducing a pressure in a space between the base and the substrate through the air passage. It is preferred that the vacuum chuck method of the present invention include, as the step of applying a downward external force to a central portion of the substrate, a step of reducing, by using the vacuum chuck member of the present invention as the vacuum chuck member, a pressure in a space between the base and the substrate on an inner side of the auxiliary annular rib through the part of the air passage.

Advantageous Effects of Invention

According to the vacuum chuck member of the present invention, when the substrate is placed on the upper surface side of the base, the annular rib and the auxiliary annular rib are elastically deformed due to the weight of the substrate and are brought into contact with the lower surface of the substrate at least partially in the circumferential direction. In this state, the pressure in a space (inner space) surrounded by the upper surface of the base, the lower surface of the substrate, and the inner side surface of the auxiliary annular rib is reduced through the part of the air passage. Accordingly, the substrate is fixed to the base in a state in which the posture of the substrate at the central portion is locally corrected and kept flat. Subsequently, the pressure in a space (outer space) surrounded by the upper surface of the base, the lower surface of the substrate, the outer side surface of the auxiliary annular rib, and the inner side surface of the annular rib is reduced through another air passage. Accordingly, the substrate is fixed to the base in a state in which the posture of the substrate at a peripheral portion which is located on an outer side of the central portion is corrected and kept flat. As a result, the substrate can be chucked and held by the vacuum chuck member without misalignment even if the substrate has a relatively large deflection amount or warpage amount.

According to the vacuum chuck method of the present invention, in addition to the above-mentioned pressure reduction in the inner space, the pressure in the outer space may be reduced while applying the downward external force by, for example, blowing air over the central portion of the substrate or pressing the central portion of the substrate with a jig from above the substrate. Also in this case, the substrate can similarly be chucked and held by the vacuum chuck member without misalignment even if the substrate has a relatively large amount of deflection or warpage.

BRIEF DESCRIPTION OF DRAWINGS

FIG. 2 is a sectional view taken along the line II-II of FIG. 1.

FIG. 4A is an illustration regarding a vacuum chuck method for a wafer, the method using the vacuum chuck member.

FIG. 4B is an illustration regarding the vacuum chuck method for a wafer, the method using the vacuum chuck member.

DESCRIPTION OF EMBODIMENTS

Structure

Figure 1:
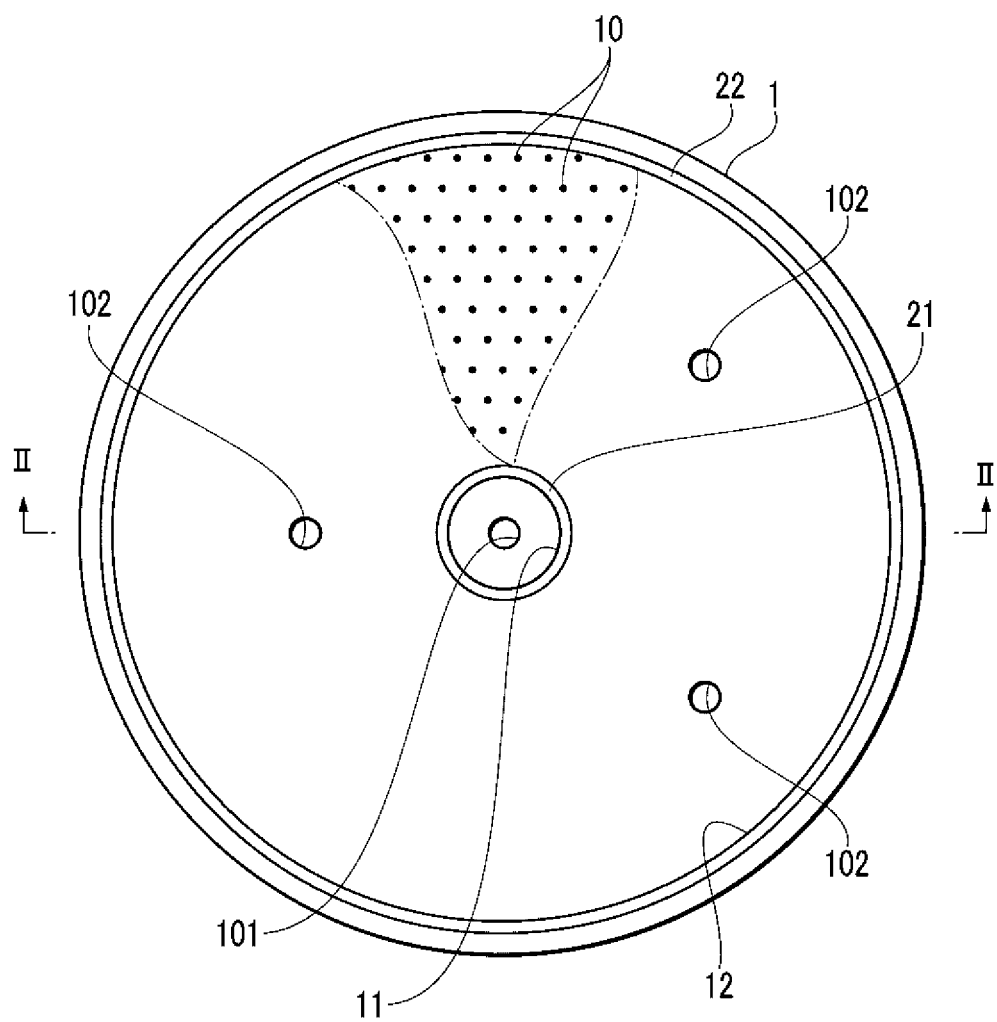
FIG. 1 is an illustration of a structure of a vacuum chuck member according to an embodiment of the present invention.

A vacuum chuck member according to an embodiment of the present invention, which is illustrated in FIG. 1 and FIG. 2, includes a base 1 for chucking and holding a wafer W (substrate) on an upper surface side thereof. The base 1 is formed of a sintered ceramic product having a substantially disc-like shape. The shape of the base 1 may be a polygonal plate-like shape, an elliptical disc-like shape, or various other shapes as well as the substantially disc-like shape.

In the base 1, a first air passage 101 and a second air passage 102 are formed as air passages that are open on the upper surface. Each of the first air passage 101 and the second air passage 102 is connected to a common or individual vacuum suction apparatus (not illustrated).

The numbers of openings and the positions of the first air passage 101 and the second air passage 102 on the upper surface of the base 1 may appropriately be changed under conditions that the opening of the first air passage 101 is arranged in an area located on an inner side of an inner annular groove portion 11 and the opening of the second air passage 102 is arranged in an area located on an outer side of the inner annular groove portion 11 and on an inner side of an outer annular groove portion 12. Each of the first air passage 101 and the second air passage 102 is formed of a through hole extending in a top-to-bottom direction of the base 1 and may also be formed of a passage extending inside the base 1 or a groove extending along the lower surface (back surface) of the base 1. In the case where the groove is formed along the lower surface of the base 1, the groove constitutes a part of the air passage when the base 1 is joined to the upper surface of a pedestal (not illustrated).

Projecting portions 10 that project from the upper surface of the base 1, the inner annular groove portion 11 (auxiliary annular groove portion) that is recessed in a circular ring-like shape from the upper surface of the base 1 at the central portion of the base 1, and the outer annular groove portion 12 that is recessed in a circular ring-like shape from the upper surface of the base 1 along the outer peripheral edge portion of the base 1 are formed on the base 1. An inner annular rib 21 having a circular ring-like shape is fitted to the inner annular groove portion 11. An outer annular rib 22 having a circular ring-like shape is fitted to the outer annular groove portion 12. In FIG. 1 and FIG. 2, the projecting portions 10, the inner annular groove portion 11, the outer annular groove portion 12, the first annular rib 21, and the second annular rib 22 are defaulted for clarity of the structure of the vacuum chuck member. The aspect ratio of each constituent element in a sectional view, the ratio between the width or height and the mutual distance, and the like are different from those in the actual case.

Through holes (not illustrated) may be formed in the base 1. Lift pins may extend through the through holes for adjusting the distance between the upper surface of the base 1 and the lower surface of the wafer W by raising or lowering the wafer W.

The projecting portions 10 are arranged at predetermined intervals in a circumferential direction and a radial direction in a concentric pattern about the center of the base 1. The projecting portions 10 may be arranged regularly in a triangular lattice pattern, a square lattice pattern, or other patterns, or may also be arranged locally irregularly so that a difference in density is locally made in the circumferential direction or the radial direction. The interval or pitch between the projecting portions 10 is designed to be, for example, 8 [mm] or less, preferably 6 [mm], more preferably 4 [mm] or less. The projecting amount of the projecting portions 10 from the upper surface of the base 1 is designed to fall within a range of, for example, 50 to 200 [μm].

The projecting portions 10 are formed into a columnar shape such as a shape of a circular column or a polygonal column, a frustum shape such as a shape of a truncated cone or a truncated pyramid, a shape of a stepped column or frustum defined so that the cross section area is smaller in the upper portion than in the lower portion, or other shapes. The diameter of the upper end portion (portion that contacts with the wafer W) of the projecting portions 10 is designed to be 500 [μm] or less. The surface roughness Ra of the upper end portion (portion that contact with the wafer W) of the projecting portions 10 is designed to fall within a range of 0.01 to 0.50 [μm].

The inner annular groove portion 11 is formed at a position corresponding to the central portion of the wafer W (which means, for example, an area where the distance from the center of the wafer W having a radius R is 0.1 R or less, 0.25 R or less, or 0.4 R or less). The inner annular groove portion 11 surrounds the first air passage 101 and the projecting portions 10 which are present around the first air passage 101. The outer annular groove portion 12 is formed at a position corresponding to the outer peripheral edge portion of the wafer W (which means, for example, an area where the distance from the center of the wafer W having the radius R is 0.9 R or more or 0.95 R or more). The outer annular groove portion 12 surrounds the second air passage 102 and the projecting portions 10 which are present on the outer side of the inner annular groove portion 11.

The shape of each of the inner annular groove portion 11 and the outer annular groove portion 12 in a top view of the base 1 (see FIG. 1), the shape of each of the inner annular groove portion 11 and the outer annular groove portion 12 in a cross-sectional view of the base 1 (see FIG. 2), and the width (in the radial direction of the base 1) and the depth of each of the inner annular groove portion 11 and the outer annular groove portion 12 may be designed variously depending on the shape, the size, and the like of each of the inner annular rib 21 and the outer annular rib 22 that is fitted to the corresponding one of the inner annular groove portion 11 and the outer annular groove portion 12.

The lower portion of the inner annular rib 21 is accommodated in the inner annular groove portion 11 and the upper portion of the inner annular rib 21 projects upward over the upper surface of the base 1. The lower portion of the outer annular rib 22 is accommodated in the outer annular groove portion 12 and the upper portion of the outer annular rib 22 projects upward over the upper surface of the base 1.

Each of the inner annular rib 21 and the outer annular rib 22 is formed of a material having an elasticity, such as silicone rubber or a sponge-like porous body, or of a synthetic resin. Each of the inner annular rib 21 and the outer annular rib 22 has such an elasticity as to be elastically deformed downward due to a load of the wafer W when the wafer W is placed on the upper surface side of the vacuum chuck member and to be restored to the original shape when each of the inner annular rib 21 and the outer annular rib 22 is relieved from the load.

Figure 3A:
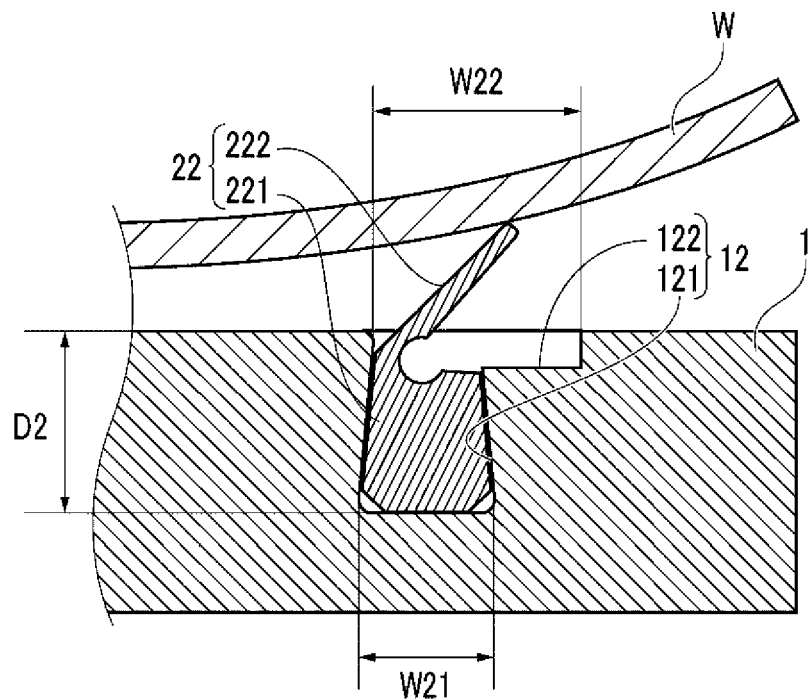
FIG. 3A is an illustration of a structure of an annular groove portion and an annular rib.

According to an example of FIG. 3A, the outer annular groove portion 12 is constituted by a first groove portion 121 having a substantially trapezoidal shape in cross section and extending in an annular shape, and a second groove portion 122 extending in an annular shape so as to expand the upper portion of the first groove portion 121 toward an outer side in a radial direction of the base 1. The outer annular rib 22 is constituted by an annular lower portion 221 fitted to or interfitted with the first groove portion 121, and an upper portion 222 on an annular flap, which extends obliquely outward over the entire periphery from an inner area of the upper end of the lower portion 221. The outer annular rib 22 is elastically deformed so that the upper portion 222 is tilted outward with respect to the lower portion 221 due to the load of the wafer W, and at least a part of the upper portion 222 is accommodated in the second groove portion 122. In order to facilitate such elastic deformation of the outer annular rib 22, the root of the upper portion 222 is formed thin over the entire periphery.

Figure 3B:
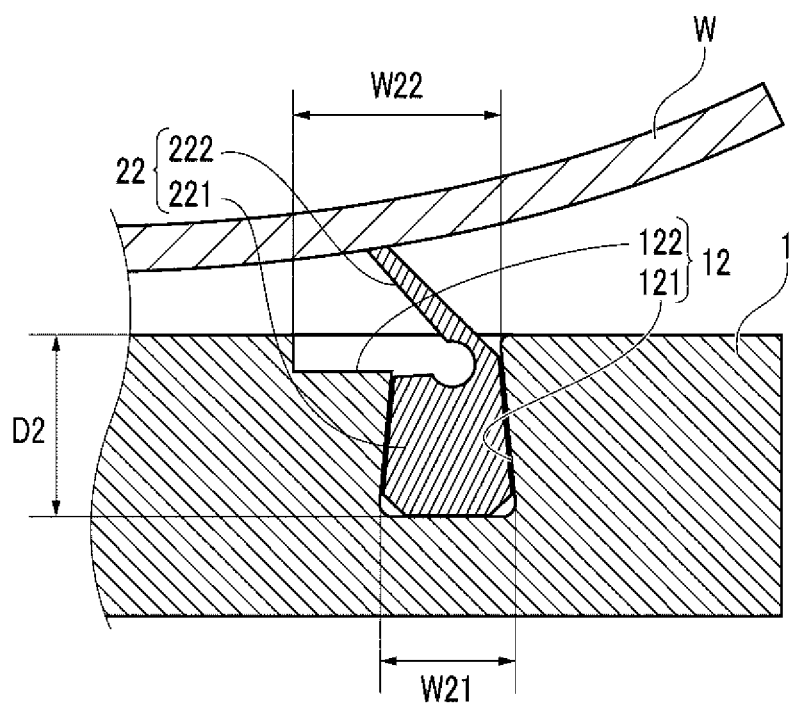
FIG. 3B is an illustration of a structure of the annular groove portion and the annular rib.

According to an example of FIG. 3B, the outer annular groove portion 12 is constituted by a first groove portion 121 having a substantially trapezoidal shape in cross section and extending in an annular shape, and a second groove portion 122 extending in an annular shape so as to expand the upper portion of the first groove portion 121 toward an inner side in a radial direction of the base 1. The outer annular rib 22 is constituted by an annular lower portion 221 fitted to or interfitted with the first groove portion 121, and an upper portion 222 on an annular flap, which extends obliquely inward over the entire periphery from an outer area of the upper end of the lower portion 221. The outer annular rib 22 is elastically deformed so that the upper portion 222 is tilted inward with respect to the lower portion 221 due to the load of the wafer W, and at least a part of the upper portion 222 is accommodated in the second groove portion 122. In order to facilitate such elastic deformation of the outer annular rib 22, the root of the upper portion 222 is formed thin over the entire periphery.

The inner annular groove portion 11 and the inner annular rib 21 may be constituted similarly to the illustrations of FIG. 3A and FIG. 3B.

Production Method

The vacuum chuck member having the structure described above is produced through, for example, the following procedure. That is, a molded product having a substantially disc-like shape is produced from raw material powder. A sintered product having a substantially disc-like shape is produced by firing the molded product. Examples of the raw material powder to be used include silicon carbide having a purity of 97% or more, and mixed raw material powder obtained by adding an appropriate amount of sintering additive to the silicon carbide as necessary. Alternatively, alumina powder or other ceramic powder may be used as the raw material powder. Under the conditions described above, the projecting portions 10, the inner annular groove portion 11, the outer annular groove portion 12, the first air passage 101, and the second air passage 102 are formed in the sintered product by an appropriate working process such as blasting or milling. Then, the inner annular rib 21 and the outer annular rib 22 are respectively fitted to the inner annular groove portion 11 and the outer annular groove portion 12. Through the steps described above, the vacuum chuck member 1 having the structure described above is produced.

Function

According to the vacuum chuck member having the structure described above, when the wafer W is placed on the upper surface side of the base 1, the inner annular rib 21 (auxiliary annular rib) and the outer annular rib 22 are elastically deformed due to the weight of the wafer W and are brought into contact with the lower surface of the wafer W at least partially in the circumferential direction (see FIG. 2).

In this state, as illustrated in FIG. 4A, the pressure in an inner space S1 surrounded by the upper surface of the base 1, the lower surface of the wafer W, and the inner side surface of the inner annular rib 21 is reduced through the first air passage 101. Accordingly, the posture of the wafer W at the central portion is locally corrected or kept flat.

Subsequently, as illustrated in FIG. 4B, the pressure in an outer space S2 surrounded by the upper surface of the base 1, the lower surface of the wafer W, the outer side surface of the inner annular rib 21, and the inner side surface of the outer annular rib 22 is reduced through the second air passage 102. Accordingly, the posture of the wafer W at a peripheral portion which is located on an outer side of the central portion is corrected or kept flat.

As a result, the wafer W can be chucked and held by the vacuum chuck member while securing flatness without misalignment even if the wafer W has a relatively large deflection amount or warpage amount.

Note that, when the pressures are reduced through the first air passage 101 and the second air passage 102 by individual vacuum suction apparatuses, the pressures in the inner space S1 and the outer space S2 are sequentially reduced by adjusting the timing to operate one of the individual vacuum suction apparatuses and the timing to operate the other thereof (or by adjusting the timing to open on-off each of valves provided in the respective passages). When the pressures are reduced through the first air passage 101 and the second air passage 102 by a common vacuum suction apparatus, the pressures in the inner space S1 and the outer space S2 are sequentially reduced by installing an on-off valve in a passage interconnecting the vacuum suction apparatus and the second air passage 102 and adjusting the timing to operate the vacuum suction apparatus and the timing to open the on-off valve. When the pressures are reduced through the first air passage 101 and the second air passage 102 by a common vacuum suction apparatus, the pressures in the inner space S1 and the outer space S2 may sequentially be reduced by providing a level difference in fluid resistance in such a manner that the distance along a passage between the vacuum suction apparatus and the upper opening of the first air passage 101 is shorter than the distance along a passage between the vacuum suction apparatus and the upper opening of the second air passage 102.

REFERENCE SIGNS LIST

1 . . . base, 10 . . . projecting portion, 11 . . . inner annular groove portion (auxiliary annular groove portion), 12 . . . outer annular groove portion, 21 . . . inner annular rib (auxiliary annular rib), 22 . . . outer annular rib, 101 . . . first air passage, 102 . . . second air passage, W . . . wafer (substrate).

The invention claimed is:

1. A vacuum chuck member comprising:

a base having a substantially flat upper surface with an annular groove portion formed to be recessed in an annular shape from the upper surface of the base and in which a first air passage that communicates with an outside through the upper surface is formed on an inner side of the annular groove portion and a second air passage that communicates with an outside through the upper surface is formed on an outer side of the annular groove portion; and an annular rib which is formed of an elastic material and a lower portion of which is accommodated in the annular groove portion in a state in which an upper portion of the annular rib projects in an annular shape from the upper surface of the base, the vacuum chuck member being configured to chuck and hold a substrate by reducing a pressure in a space, which is defined by the base, the annular rib, and the substrate, through the air passage in a state in which the substrate is placed on an upper surface side of the vacuum chuck member, wherein an auxiliary annular groove portion is formed to be recessed in an annular shape from the upper surface of the base on an inner side of the annular groove portion and to correspond to a central portion of the substrate, wherein a part of the air passage is formed inside the base so as to communicate with a space above the upper surface of the base on an inner side of the auxiliary annular groove portion, wherein the vacuum chuck member further comprises an auxiliary annular rib which is formed of an elastic material and a lower portion of which is accommodated in the auxiliary annular groove portion in a state in which an upper portion of the auxiliary annular rib projects in an annular shape from the upper surface of the base, wherein the first air passage does not communicate with the second air passage in the base, wherein at least one of the auxiliary annular groove portion and the annular groove portion includes an inner sidewall and an outer sidewall defining a first groove portion extending in an annular shape and a second groove portion extending in an annular shape, the first groove portion having a first width and the second groove portion having a second width greater than the first width such that the second groove portion extends beyond an upper portion of the first groove portion toward an inner side or an outer side in a radial direction of the base, the second groove portion accommodating at least the upper portion of the corresponding annular rib or auxiliary annular rib when the upper portion of the corresponding annular rib or auxiliary annular rib is elastically deformed, wherein the auxiliary annular groove portion and the annular groove portion are spaced apart from each other, wherein the first width is a maximum width of the first groove portion in the radial direction of the base between the inner sidewall and the outer sidewall, and the first groove portion becomes narrower towards the upper surface of the base, and wherein the second width is a maximum width of the second groove portion in the radial direction of the base between the inner sidewall and the outer sidewall.

2. The vacuum chuck member of claim 1, wherein the distance between the center of the base and the auxiliary annular groove portion is 0.4 R or less, and a distance between the center of the base and the annular groove portion is 0.9 R or more, where R is a radius of the base.

3. The vacuum chuck member of claim 1, wherein a distance between a center of the base and the auxiliary annular groove portion is shorter than a distance between the auxiliary annular groove portion and the annular groove portion.

4. A vacuum chuck method for chucking and holding a substrate by using a vacuum chuck member including a base having a substantially flat upper surface with an annular groove portion formed to be recessed in an annular shape from the upper surface of the base and a first air passage that communicates with a space above the upper surface is formed on an inner side of the annular groove portion and a second air passage that communicates with an outside through the upper surface is formed on an outer side of the annular groove portion, and an annular rib that is formed of an elastic material and fixed to the base in a state in which a lower portion of the annular rib is accommodated in the annular groove portion and an upper portion of the annular rib projects in an annular shape from the upper surface of the base, the method comprising:

a step of placing the substrate on the vacuum chuck member so that a lower surface of the substrate is brought into contact with an annular upper end of the annular rib at least partially along a circumferential direction;

a step of applying a downward external force to a central portion of the substrate;

a step of reducing a pressure in an inner space between the base and the substrate on the inner side of the annular groove portion through the first air passage; and a step of reducing a pressure in an outer space between the base and the substrate on the outer side of the annular groove portion through the second air passage;

wherein the pressures in the inner space and the outer space are sequentially reduced, wherein an outer annular groove portion is formed to be recessed in an annular shape from the upper surface of the base on an outer side of the annular groove portion, wherein the vacuum chuck member further comprises an outer annular rib which is formed of an elastic material and a lower portion of which is accommodated in the outer annular groove portion in a state in which an upper portion of the outer annular rib projects in an annular shape from the upper surface of the base, wherein at least one of the annular groove portion and the outer annular groove portion includes an inner sidewall and an outer sidewall defining a first groove portion extending in an annular shape and a second groove portion extending in an annular shape, the first groove portion having a first width and the second groove portion having a second width greater than the first width such that the second groove portion extends beyond an upper portion of the first groove portion toward an inner side or an outer side in a radial direction of the base, the second groove portion accommodating at least the upper portion of the corresponding outer annular rib or annular rib when the upper portion of the corresponding outer annular rib or annular rib is elastically deformed, wherein the annular groove portion and the outer annular groove portion are spaced apart from each other, wherein the first width is a maximum width of the first groove portion in the radial direction of the base between the inner sidewall and the outer sidewall, and the first groove portion becomes narrower towards the upper surface of the base, and wherein the second width is a maximum width of the second groove portion in the radial direction of the base between the inner sidewall and the outer sidewall.

5. The vacuum chuck method according to claim 4, wherein a distance between a center of the base and the annular groove portion is shorter than a distance between the annular groove portion and the outer annular groove portion.

6. The vacuum chuck method according to claim 4, wherein a distance between a center of the base and the annular groove portion is 0.4 R or less, and a distance between the center of the base and the outer annular groove portion is 0.9 R or more, where R is a radius of the base.

* * * * *